(12) United States Patent
Seitz

(10) Patent No.: US 7,196,947 B2
(45) Date of Patent: Mar. 27, 2007

(54) RANDOM ACCESS MEMORY HAVING VOLTAGE PROVIDED OUT OF BOOSTED SUPPLY VOLTAGE

(75) Inventor: Helmut Seitz, Essex Junction, VT (US)

(73) Assignee: Infineon Technologies North America Corp., San Jose, CA (US)

(*) Notice: Subject to any disclaimer, the term of this patent is extended or adjusted under 35 U.S.C. 154(b) by 23 days.

(21) Appl. No.: 11/153,969

(22) Filed: Jun. 16, 2005

(65) Prior Publication Data

US 2006/0233029 A1 Oct. 19, 2006

Related U.S. Application Data

(63) Continuation-in-part of application No. 11/108,186, filed on Apr. 18, 2005.

(51) Int. Cl.
*G11C 7/00* (2006.01)
(52) U.S. Cl. .................... 365/189.11; 365/189.09; 365/104
(58) Field of Classification Search ........... 365/189.11, 365/189.09, 226, 104; 327/541
See application file for complete search history.

(56) References Cited

U.S. PATENT DOCUMENTS

| | | | |
|---|---|---|---|
| 5,406,523 A | 4/1995 | Foss et al. | |
| 5,703,827 A | 12/1997 | Leung et al. | |
| 5,726,944 A | 3/1998 | Pelley, III et al. | |
| 5,805,435 A | 9/1998 | Pascucci | |
| 5,805,509 A | 9/1998 | Leung et al. | |
| 5,844,404 A | 12/1998 | Caser et al. | |
| 5,856,951 A * | 1/1999 | Arimoto et al. | 365/226 |
| 6,580,650 B2 * | 6/2003 | Ellis et al. | 365/189.09 |
| 6,600,692 B2 | 7/2003 | Tanzawa | |
| 6,741,118 B2 * | 5/2004 | Uchikoba et al. | 327/541 |
| 6,822,892 B2 * | 11/2004 | Baker | 365/148 |

* cited by examiner

*Primary Examiner*—Anh Phung
*Assistant Examiner*—Dang Nguyen
(74) *Attorney, Agent, or Firm*—Dicke, Billig & Czaja, PLLC

(57) ABSTRACT

A random access memory including an array of single transistor memory cells and a voltage source. The voltage source is configured to receive a boosted supply voltage and a reference voltage. The voltage source is configured to provide an output voltage out of the boosted supply voltage and based on the reference voltage.

31 Claims, 3 Drawing Sheets

RANDOM ACCESS MEMORY HAVING VOLTAGE PROVIDED OUT OF BOOSTED SUPPLY VOLTAGE

CROSS-REFERENCE TO RELATED APPLICATIONS

This application is a Continuation in Part of patent application Ser. No. 11/108,186 filed on Apr. 18, 2005, and which is herein incorporated by reference.

BACKGROUND

Often, a computer system includes a controller, such as a micro-processor, and one or more memory chips, such as random access memory (RAM) chips. The RAM chips can be any suitable type of RAM, such as dynamic RAM (DRAM), double data rate synchronous DRAM (DDR-SDRAM), graphics DDR-SDRAM (GDDR-SDRAM), reduced latency DRAM (RLDRAM), and pseudo-static RAM (PSRAM). The PSRAM can be based on DRAM and provides significant advantages in density and speed over traditional static RAM (SRAM).

Typically, a DRAM includes one transistor and one capacitor memory cells arranged in one or more arrays of memory cells, which are arranged in memory banks. Conductive word lines, referred to as row select lines, extend in one direction across an array of memory cells and conductive bit lines, referred to as digit lines, extend in another direction across the array of memory cells. A memory cell is located at each cross point of a word line and a bit line.

The DRAM includes one or more row decoders, one or more column decoders, and sense amplifiers. The sense amplifiers can be differential sense amplifiers, wherein each sense amplifier receives one bit line at each of two differential inputs. To read or write memory cells, the DRAM receives a row address, a column address, and control signals, such as row address select (RAS) and column address select (CAS) signals. A row decoder receives the row address to select a word line or row of memory cells and the row address is latched into the row decoder via the RAS signal. A column decoder receives the column address to select one or more bit lines or columns of memory cells and the column address is latched into the column decoder via the CAS signal. Memory cells at the intersection of the selected row and the selected columns provide data bit values.

At the sense amplifiers, one of the bit lines receives a data bit value from a selected memory cell and the other bit line is used as a reference. To read the data bit, the sense amplifier amplifies the difference between the data bit value and the reference value and provides a sensed output value to an output driver. To write a data bit into a selected memory cell, input drivers overdrive the sense amplifier. One input driver overdrives a data bit value onto the bit line that is connected to the selected memory cell and another input driver overdrives the inverse of the data bit value onto the reference bit line.

A DRAM chip receives a supply voltage, such as supply voltage VDD or supply voltage Vint, and a reference voltage, such as VSS or ground, from external circuitry. In addition, a DRAM may internally generate several other voltages. Some of these internally generated voltages are regulated out of the supply voltage and some of these internally generated voltages are pumped or boosted out of the supply voltage for a voltage that is higher than the supply voltage and out of the reference voltage for a voltage that is lower than the reference voltage.

Some DRAM chips internally generate a negative word line low voltage (VNWLL) and a negative back bias voltage (VBB). The VNWLL is a negative voltage provided on word lines to turn off memory cell transistors. VNWLL reduces or prevents sub-threshold leakage of the memory cells. VBB is a negative back bias voltage applied to the p-wells of the memory cell transistors. VBB suppresses sub-threshold leakage of memory cells and fine tunes the threshold voltage of memory cell transistors. A DRAM may use two voltage pump systems, one voltage pump system for VNWLL and one voltage pump system for VBB, to set the voltages independently for the highest data retention time. These voltage pump systems or boost circuits use valuable layout space that could otherwise be used for memory cells.

For these and other reasons there is a need for the present invention.

SUMMARY

One aspect of the present invention provides a random access memory including an array of single transistor memory cells and a voltage source. The voltage source is configured to receive a boosted supply voltage and a reference voltage. The voltage source is configured to provide an output voltage out of the boosted supply voltage and based on the reference voltage.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
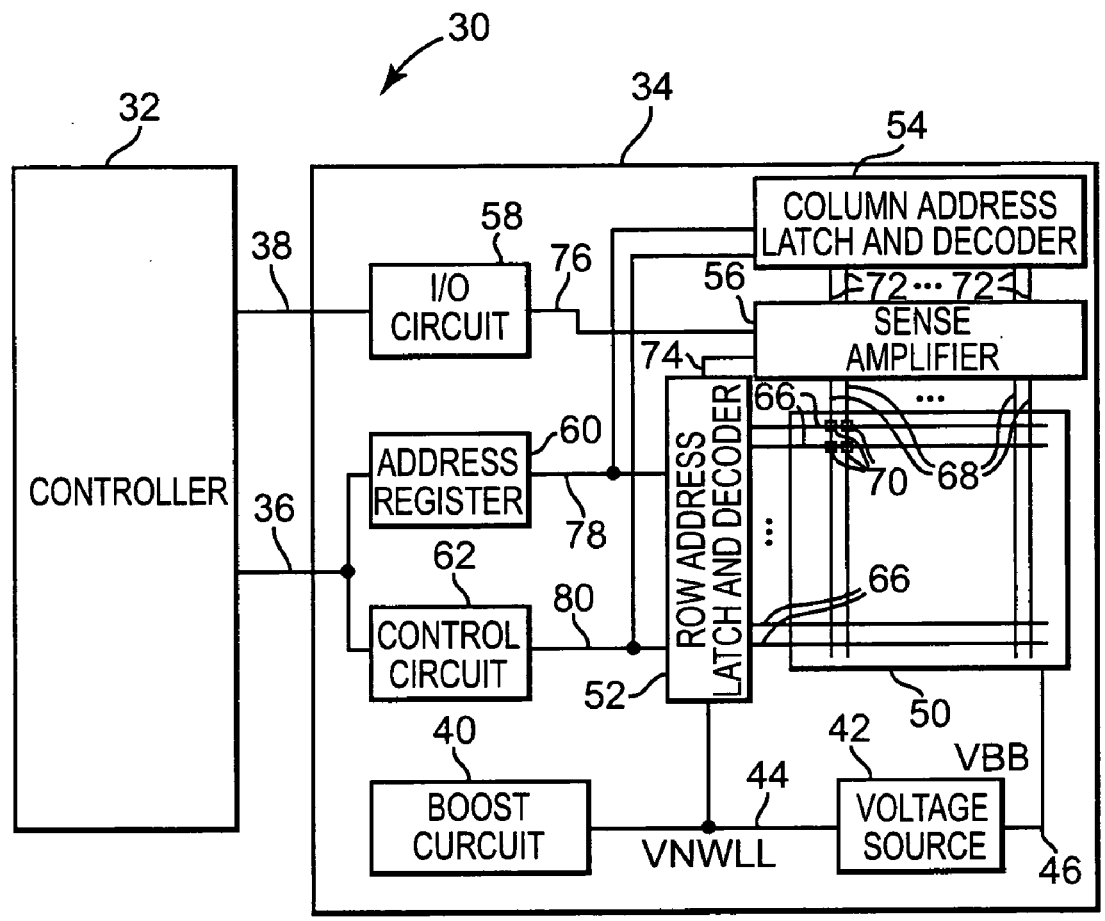
FIG. 1 is a block diagram illustrating one embodiment of a computer system according to the present invention.

FIG. 1 is a block diagram illustrating one embodiment of a computer system 30 according to the present invention. Computer system 30 includes a controller 32 and a RAM 34.

Controller 32 is electrically coupled to RAM 34 via memory communications path 36 and data communications path 38. Controller 32 provides row and column addresses and control signals to RAM 34 via memory communications path 36. Controller 32 provides data to RAM 34 and receives data from RAM 34 via data communications path 38. RAM 34 can be any suitable type of RAM, such as a DRAM, DDR-SDRAM, GDDR-SDRAM, RLDRAM, and PSRAM.

RAM 34 includes a boost circuit 40 and a voltage source 42. Boost circuit 40 is electrically coupled to voltage source 42 via word line voltage supply path 44. Boost circuit 40 receives a supply voltage, such as VDD, and a reference voltage, such as ground, and generates a negative word line low voltage VNWLL. Boost circuit 40 provides the negative word line low voltage VNWLL at 44 to voltage source 42 via word line voltage supply path 44. Voltage source 42 receives negative word line low voltage VNWLL at 44 and regulates a negative back bias voltage VBB at 46 out of the negative word line low voltage VNWLL at 44. The layout of voltage source 42 is substantially smaller than the layout of a boost circuit for independently generating the negative back bias voltage VBB at 46. The smaller layout of voltage source 42 saves valuable layout space that can be used for memory cells and/or to lower the cost of the RAM chip.

RAM 34 includes an array of memory cells 50, a row address latch and decoder 52, a column address latch and decoder 54, a sense amplifier circuit 56, a RAM I/O circuit 58, an address register 60, and a control circuit 62. Conductive word lines 66, referred to as row select lines, extend in the x-direction across the array of memory cells 50. Conductive bit lines 68, referred to as digit lines, extend in the y-direction across the array of memory cells 50. A memory cell 70 is located at each cross point of a word line 66 and a bit line 68.

Each word line 66 is electrically coupled to row address latch and decoder 52 and each bit line 68 is electrically coupled to one of the sense amplifiers in sense amplifier circuit 56. The sense amplifier circuit 56 is electrically coupled to column address latch and decoder 54 via conductive column select lines 72. Also, sense amplifier circuit 56 is electrically coupled to row address latch and decoder 52 via communications path 74 and to RAM I/O circuit 58 via I/O communications path 76. Data is transferred between RAM I/O circuit 58 and controller 32 via data communications path 38.

Controller 32 is electrically coupled to address register 60 and control circuit 62 via memory communications path 36. Address register 60 is electrically coupled to row address latch and decoder 52 and column address latch and decoder 54 via row and column address lines 78. Control circuit 62 is electrically coupled to row address latch and decoder 52 and column address latch and decoder 54 via control communications path 80.

Boost circuit 40 is electrically coupled to row address latch and decoder 52 and to voltage source 42 via word line voltage supply path 44. Boost circuit 40 provides the negative word line low voltage VNWLL at 44 to row address latch and decoder 52, which provides the negative word line low voltage VNWLL to word lines 66 to turn off memory cells 70. The negative word line low voltage VNWLL reduces or prevents sub-threshold leakage of memory cells 70 and enhances data retention. Voltage source 42 is electrically coupled to the array of memory cells 50 via back bias voltage supply path 46. Voltage source 42 receives the negative word line low voltage VNWLL at 44 and provides negative back bias voltage VBB at 46 to transistor wells of the memory cells 70 in the array of memory cells 50. The negative back bias voltage VBB at 46 suppresses sub-threshold leakage of memory cells 70 and fine tunes the threshold voltage of memory cell transistors.

Address register 60 receives row and column addresses from controller 32 via memory communications path 36. Address register 60 supplies a row address to row address latch and decoder 52 via row and column address lines 78, and control circuit 62 supplies a RAS signal to row address latch and decoder 52 via control communications path 80 to latch the supplied row address into row address latch and decoder 52. Address register 60 supplies a column address to column address latch and decoder 54 via row and column address lines 78, and control circuit 62 supplies a CAS signal to column address latch and decoder 54 via control communications path 80 to latch the supplied column address into column address latch and decoder 54.

Controller 32 and I/O circuit 58 communicate data between controller 32 and RAM 34 via data communications path 38. I/O circuit 58 includes a suitable number of transmitter and receiver pairs and controller 32 includes a suitable number of transmitter and receiver pairs. Each transmitter and receiver pair in I/O circuit 58 corresponds to a transmitter and receiver pair in controller 32. Data communications path 38 includes one or more signal lines and each transmitter and receiver pair in I/O circuit 58 is electrically coupled to the corresponding transmitter and receiver pair in controller 32 via one of the signal lines in data communications path 38.

Sense amplifier circuit 56 includes sense amplifiers, equalization and precharge circuits, and switches. The sense amplifiers are differential input sense amplifiers and each sense amplifier receives one bit line 68 at each of the two differential inputs. One of the bit lines 68 receives a data bit from a selected memory cell 70 and the other bit line 68 is used as a reference. The equalization and precharge circuits equalize the voltage on bit lines 68 connected to the same sense amplifier prior to a read or write operation. To read a data bit, a sense amplifier amplifies the difference between the data bit value and the reference value and provides a sensed output value to I/O circuit 58 via I/O communications path 76. One of the transmitter and receiver pairs in I/O circuit 58 receives the sensed output value and provides the sensed output value to the corresponding transmitter and receiver pair in controller 32 via data communications path 38. To write a data bit, one of the transmitter and receiver pairs in controller 32 provides a data bit to the corresponding transmitter and receiver pair in I/O circuit 58 via data communications path 38. I/O circuit 58 provides the data bit to a sense amplifier in sense amplifier circuit 56 via I/O communications path 76. I/O circuit 58 overdrives the sense amplifier to overdrive the data bit value onto the bit line 68 that is connected to one of the memory cells 70 and to overdrive the inverse of the data bit value onto the reference bit line 68. The sense amplifier writes the received data bit value into the selected memory cell 70.

Row address latch and decoder 52 receives row addresses and RAS signals and latches the row addresses into row address latch and decoder 52. Row address latch and decoder 52 decodes each of the row addresses to select a row of memory cells 70. Also, row address latch and decoder 52 receives the negative word line low voltage VNWLL at 44. Row address latch and decoder 52 provides the negative word line low voltage VNWLL on word lines 66 to turn off memory cells 70 that are not selected via a row address and prior to receiving a row address. The negative word line low voltage VNWLL reduces or prevents sub-threshold leakage in memory cells 70 and enhances data retention. In addition, row address latch and decoder 52 provides sense amplifier activation signals and equalization and precharge signals to sense amplifier circuit 56 via communications path 74.

Column address latch and decoder 54 activates column select lines 72 to connect sense amplifiers in sense amplifier circuit 56 to transmitter and receiver pairs in I/O circuit 58. Column address latch and decoder 54 receives a column address and latches the column address into column address latch and decoder 54. Column address latch and decoder 54 decodes the column address to select addressed column select lines 72. In addition, column address latch and decoder 54 receives column select line activation signals from control circuit 62 via control communications path 80. The column select line activation signals indicate which of the addressed column select lines 72 are to be activated by column address latch and decoder 54. Column address latch and decoder 54 activates column select lines 72 that are addressed by the column address and selected for activation by the column select line activation signals. Activated column select lines 72 are provided to sense amplifier circuit 56 to connect sense amplifiers in sense amplifier circuit 56 to transmitter and receiver pairs in I/O circuit 58.

Controller 32 provides addresses and control signals to control circuit 62 via memory communications path 36. Control circuit 62 receives the addresses and control signals from controller 32 and provides internal control signals to read data from or write data into the array of memory cells 50. Control circuit 62 provides RAS signals to row address latch and decoder 52 and CAS signals to column address latch and decoder 54. Also, control circuit 62 provides internal control signals to column address latch and decoder 52 to selectively activate column select lines 72.

In one embodiment, RAM 34 is a PSRAM and controller 32 provides SRAM control signals to control circuit 62. The SRAM control signals do not include DRAM control signals, such as RAS and CAS signals, and control circuit 62 provides the DRAM control signals in response to the SRAM control signals.

During a read operation, control circuit 62 receives read control signals and address register 60 receives the row address of a selected memory cell or cells 70. The row address is supplied from address register 60 to row address latch and decoder 52 and latched into row address latch and decoder 52 by control circuit 62 that provides a RAS signal. Row address latch and decoder 52 decodes the row address and activates the selected word line 66. Also, row address latch and decoder 52 receives the negative word line low voltage VNWLL at 44 and provides the negative word line low voltage VNWLL on word lines 66 to turn off memory cells 70 that are not selected via the row address. As the selected word line 66 is activated, the value stored in each memory cell 70 coupled to the selected word line 66 is passed to the respective bit line 68. The bit value stored at a memory cell 70 is detected by a sense amplifier that is electrically coupled to the respective bit line 68.

Next, control circuit 62 and address register 60 receive the column address of the selected memory cell or cells 70. The column address is supplied from address register 60 to column address latch and decoder 54 and latched into column address latch and decoder 54 by control circuit 62 that provides a CAS signal. The column address latch and decoder 54 decodes the column address to select column select lines 72. Control circuit 62 provides internal control signals to column address latch and decoder 54 to selectively activate column select lines 72 and connect selected sense amplifiers to transmitter and receiver pairs in I/O circuit 58. Sensed output values are provided to transmitter and receiver pairs in I/O circuit 58 and to the corresponding transmitter and receiver pairs in controller 32 via data communications path 38. Row address latch and decoder 52 provides the negative word line low voltage VNWLL on all word lines 66 to turn off all memory cells 70.

During a write operation, data to be stored in the array of memory cells 50 is supplied from transmitter and receiver pairs in controller 32 to transmitter and receiver pairs in I/O circuit 58 via data communications path 38. Control circuit 62 receives write control signals and address register 60 receives the row address of a selected memory cell or cells 70. The row address is supplied from address register 60 to row address latch and decoder 52 and latched into row address latch and decoder 52 by control circuit 62 that provides a RAS signal. The row address latch and decoder 52 decodes the row address and activates the selected word line 66. Also, row address latch and decoder 52 receives the negative word line low voltage VNWLL at 44 and provides the negative word line low voltage VNWLL on word lines 66 to turn off memory cells 70 that are not selected via the row address. As the selected word line 66 is activated, the value stored in each memory cell 70 coupled to the selected word line 66 is passed to the respective bit line 68 and the sense amplifier that is electrically coupled to the respective bit line 68.

Next, control circuit 62 and address register 60 receive the column address of the selected memory cell or cells 70. Address register 60 supplies the column address to column address latch and decoder 54 and the column address is latched into column address latch and decoder 54 by control circuit 62 via a CAS signal. Column address latch and decoder 54 receives column select line activation signals from control circuit 62 and activates selected column select lines 72 to connect sense amplifiers in sense amplifier circuit 56 to transmitter and receiver pairs in I/O circuit 58. I/O circuit 58 passes data from controller 32 to the sense amplifiers and overdrives the sense amplifiers to write data to the selected memory cell or cells 70 via bit lines 68. Row address latch and decoder 52 provides the negative word line low voltage VNWLL on all word lines 66 to turn off all memory cells 70.

Figure 2:
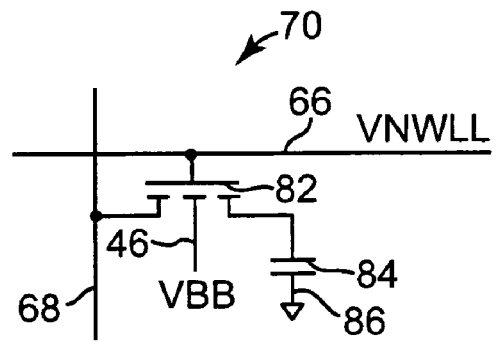
FIG. 2 is a diagram illustrating one embodiment of a random access memory cell in the array of memory cells.

FIG. 2 is a diagram illustrating one embodiment of a random access memory cell 70 in the array of memory cells 50. Memory cell 70 includes a transistor 82 and a capacitor 84. The gate of transistor 82 is electrically coupled to word line 66. One side of the drain-source path of transistor 82 is electrically coupled to bit line 68 and the other side of the drain-source path is electrically coupled to one side of capacitor 84. The other side of capacitor 84 is electrically coupled to a reference 86, such as one-half the bit line high voltage (VBLH/2). Capacitor 84 is charged and discharged to represent logic 0 or logic 1.

The transistor well of transistor 82 is electrically coupled to back bias voltage supply path 46. The negative back bias voltage VBB at 46 suppresses sub-threshold leakage in transistor 82 and fine tunes the threshold voltage of transistor 82. To turn off transistor 82, negative word line low voltage VNWLL is provided to the gate of transistor 82 via word line 66. The negative word line low voltage VNWLL reduces or prevents sub-threshold leakage in transistor 82 and enhances data retention on capacitor 84.

During a read operation, a high voltage level is provided on word line 66 to turn on transistor 82. The data bit value stored on capacitor 84 is read by a sense amplifier via bit line 68. During a write operation, a high voltage level is provided on word line 66 to turn on transistor 82 and access capacitor 84. The sense amplifier connected to bit line 68 is overdriven to write a data bit value on capacitor 84 via bit line 68 and transistor 82.

A read operation on memory cell 70 is a destructive read operation. After each read operation, capacitor 84 is recharged or discharged to the data bit value that was just read. In addition, even without read operations, the charge on capacitor 84 discharges over time. To retain a stored data bit value, memory cell 70 is refreshed periodically by reading and/or writing memory cell 70. All memory cells 70 in the array of memory cells 50 are periodically refreshed to maintain their data bit values.

Figure 3:
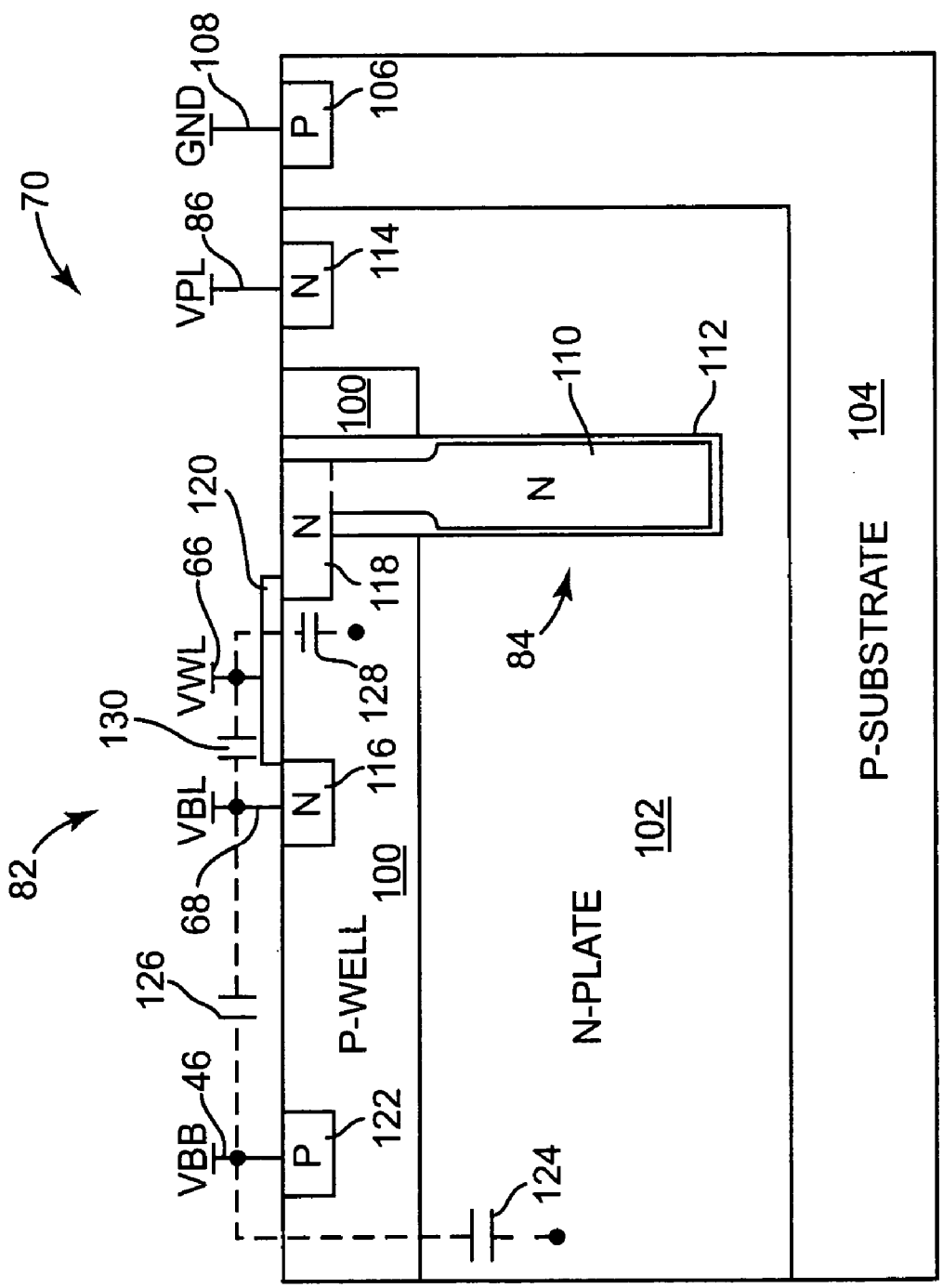
FIG. 3 is a diagram illustrating one embodiment of a layout of a memory cell in the array of memory cells.

FIG. 3 is a diagram illustrating one embodiment of a layout of memory cell 70 in the array of memory cells 50. Memory cell 70 includes transistor 82 and capacitor 84. Transistor 82 is situated in a p-type transistor well (p-well) 100 that is situated in an n-type plate region (n-plate) 102. Capacitor 84 is a trench capacitor that extends through p-well 100 and into n-plate 102. N-plate 102 is situated in a p-type substrate (p-substrate) 104 that includes a p-type plug 106. P-substrate 104 is electrically coupled to a reference, such as ground, at 108 via p-type plug 106. In one embodiment, p-type plug 106 is a p+ region.

Capacitor 84 includes an internal n-type region 110 and a dielectric 112 that encompasses the internal n-type region 110. Dielectric 112 isolates internal n-type region 110 from p-well 100 and n-plate 102. One conductive plate of capacitor 84 is internal n-type region 110 and the other conductive plate of capacitor 84 is n-plate 102. Dielectric 112 is the capacitive dielectric situated between the two plates of internal n-type region 110 and n-plate 102. N-plate 102 includes an n-type plug 114 that electrically couples n-plate 102 to a reference at 86 that receives plate voltage VPL at 86. Capacitor 84 is charged and discharged via transistor 82 to store logic 0 or logic 1. In one embodiment, internal n-type region 110 is an n+ region. In one embodiment, n-type plug 114 is an n+ region. In one embodiment, n-plate 102 is an n+ region. In one embodiment, voltage VPL at 86 is substantially equal to 0.75 volts, which is one-half the bit line high voltage (VBLH/2).

Transistor 82 includes an n-type drain/source region 116, an n-type source/drain region 118, and a gate oxide region 120. N-type drain/source region 116 is electrically coupled to bit line 68 and n-type source/drain region 118 is electrically coupled to internal n-type region 110 of capacitor 84. In one embodiment, n-type drain/source region 116 is an n+ region. In one embodiment, n-type source/drain region 118 is an n+ region.

Gate oxide region 120 is electrically coupled to word line 66 and receives word line voltage VWL at 66. The word line voltage VWL at 66 can be an active word line voltage VPP to turn on transistor 82 and access capacitor 84 or an inactive or standby negative word line low voltage VNWLL to turn off transistor 82 and prevent leakage from capacitor 84. In one embodiment, active word line voltage VPP is substantially equal to 2.9 volts. In one embodiment, negative word line low voltage VNWLL is substantially equal to −0.5 volts.

N-type drain/source region 116 is electrically coupled to bit line 68, which receives bit line voltage VBL at 68. Prior to a read or write operation, bit line voltage VBL at 68 is equalized to an inactive or standby bit line equalization voltage VBLEQ. During a read operation, bit line voltage VBL is charged via capacitor 84 to a higher voltage than the bit line equalization voltage VBLEQ or discharged via capacitor 84 to a lower voltage than bit line equalization voltage VBLEQ. During a write operation, bit line voltage VBL at 68 can be an active bit line high voltage VBLH that represents one logic level, such as logic 1, or an active bit line low voltage VBLL that represents the other logic level, such as logic 0. In one embodiment, during a write operation, active bit line high voltage VBLH is substantially equal to 1.5 volts. In one embodiment, during a write operation, active bit line low voltage VBLL is substantially equal to ground. In one embodiment, inactive or standby bit line equalization voltage VBLEQ is substantially equal to 0.75 volts.

P-well 100 includes a p-type plug 122 that electrically couples p-well 100 to back bias voltage supply path 46 and receives negative back bias voltage VBB at 46. The negative back bias voltage VBB at 46 suppresses sub-threshold leakage in transistor 82 and fine tunes the threshold voltage of transistor 82. To turn off transistor 82, negative word line low voltage VNWLL is provided as the word line voltage VWL at 66 to gate oxide region 120. The negative word line low voltage VNWLL reduces or prevents sub-threshold leakage in transistor 82 and enhances charge retention in capacitor 84. A voltage source, such as voltage source 42, receives the boosted negative word line low voltage VNWLL from a boost circuit, such as boost circuit 40, and provides the negative back bias voltage VBB. In one embodiment, negative word line low voltage VNWLL is substantially equal to −0.5 volts. In one embodiment, negative back bias voltage VBB is substantially equal to −0.15 volts.

RAM 34 and each memory cell 70 in the array of memory cells 50 includes capacitances. RAM 34 and memory cell 70 includes a p-well to n-plate capacitance 124, a p-well to bit line capacitance 126, a p-well to word line capacitance 128, and a bit line to word line capacitance 130. These capacitances 124, 126, 128, and 130 are charged and discharged at power up and during operation.

At power up, word lines 66 are charged to a word line voltage, such as a negative word line low voltage VNWLL of −0.5 volts, and p-well 102 is charged to a negative back bias voltage VBB, such as −0.15 volts. Also, bit lines 68 are charged to a bit line voltage VBL, such as a bit line equalization voltage VBLEQ of 0.75 volts, and the reference at 86 is charged to a plate voltage VPL, such as 0.75 volts. To charge p-well 102 to a negative back bias voltage VBB, such as −0.15 volts, back bias voltage VBB charges the p-well to n-plate capacitance 124, the p-well to bit line capacitance 126, and the p-well to word line capacitance 128. To charge word lines 66 to a negative word line low voltage VNWLL, such as −0.5 volts, negative word line low voltage VNWLL charges the p-well to word line capacitance 128 and bit line to word line capacitance 130. At power up, back bias voltage VBB charges a larger capacitance value than negative word line low voltage VNWLL.

During operation, active word lines 66 receive the active word line voltage VPP, such as 2.9 volts, to turn on memory cell transistors, such as transistor 82. At the end of the operation, the active word lines 66 are pulled to negative word line low voltage VNWLL, such as −0.5 volts, to turn off the memory cell transistors. Negative word line low voltage VNWLL discharges p-well to word line capacitance 128 and bit line to word line capacitance 130 to pull word lines 66 from the positive active word line voltage VPP to the negative word line low voltage VNWLL. Very little charge leaks from p-well to n-plate capacitance 124, p-well to bit line capacitance 126, and p-well to word line capacitance 128, such that back bias voltage VBB compensates for very little leakage during operation of RAM 34. During operation, negative word line low voltage VNWLL provides a larger charge than back bias voltage VBB.

Back bias voltage VBB charges a larger capacitance at power up and compensates for a smaller charge during operation, while negative word line low voltage VNWLL does the opposite in charging a smaller capacitance at power up and providing a larger charge during operation. Negative back bias voltage VBB can be regulated out of negative word line low voltage VNWLL and a boost circuit, such as boost circuit 40. A separate boost circuit is not needed for negative back bias voltage VBB, which saves layout space and/or reduces the cost of the RAM chip.

Figure 4:
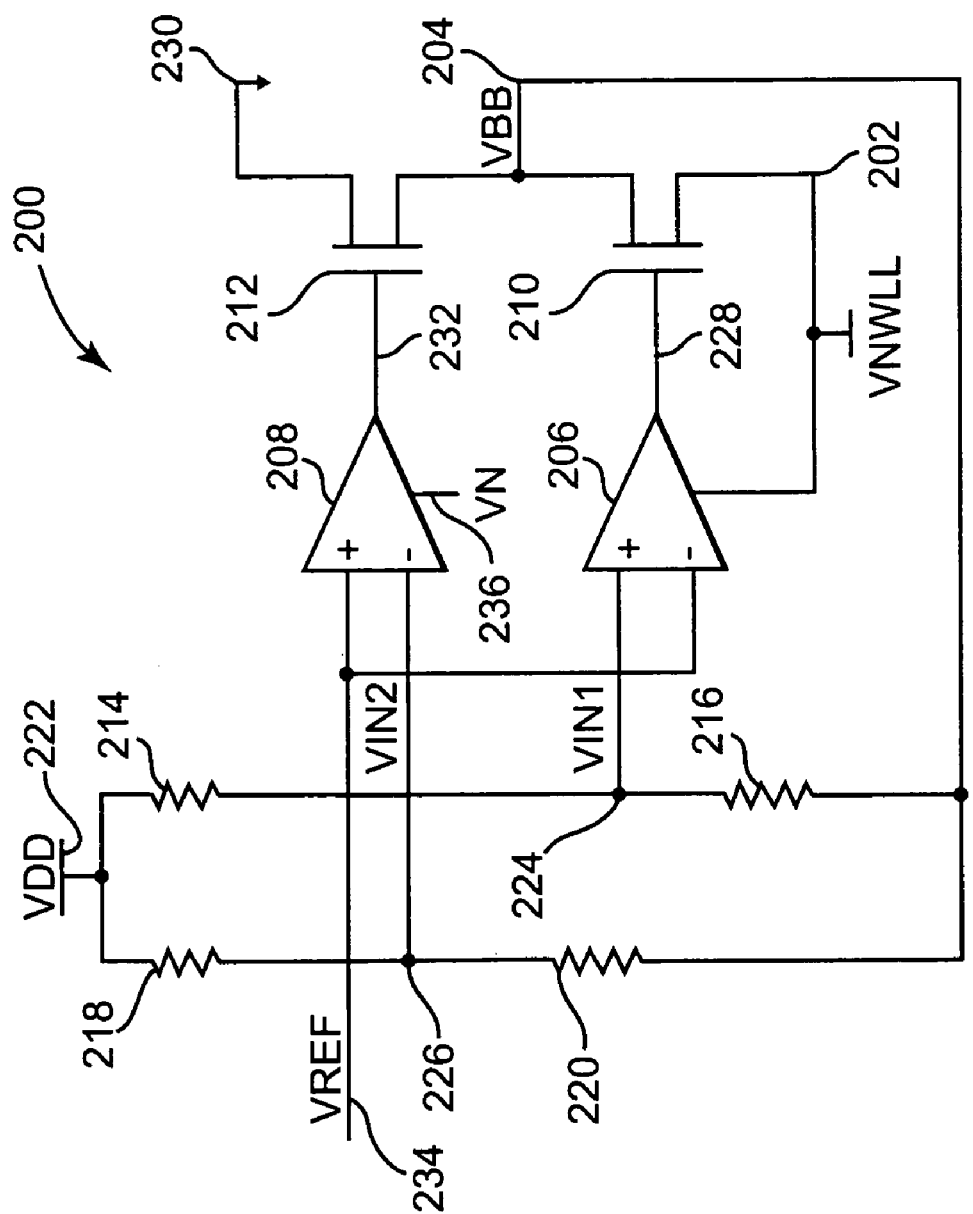
FIG. 4 is a diagram illustrating a voltage source that provides a negative back bias voltage out of a negative word line low voltage.

FIG. 4 is a diagram illustrating a voltage source 200 that receives a negative word line low voltage VNWLL at 202 and provides a negative back bias voltage VBB at 204 out of negative word line low voltage VNWLL at 202. Negative word line low voltage VNWLL at 202 is a boosted voltage provided via a boost circuit, such as boost circuit 40. Also, negative word line low voltage VNWLL at 202 is more negative than negative back bias voltage VBB at 204. In one embodiment, negative word line low voltage VNWLL at 202 is substantially at a voltage level of –0.5 volts and negative back bias voltage VBB at 204 is regulated to substantially a voltage level of –0.15 volts.

Voltage source 200 includes a first comparator 206, a second comparator 208, a first transistor 210, and a second transistor 212. Also, voltage source 200 includes a first resistor 214, a second resistor 216, a third resistor 218, and a fourth resistor 220, which provide feedback voltages from negative back bias voltage VBB at 204 to inputs of first and second comparators 206 and 208.

One side of first resistor 214 and one side of third resistor 218 are electrically coupled to a power supply voltage VDD at 222. Power supply voltage VDD at 222 can be a positive voltage, such as 1.5 volts. The other side of first resistor 214 is electrically coupled at 224 to one side of second resistor 216 and the positive input of first comparator 206. The other side of third resistor 218 is electrically coupled at 226 to one side of fourth resistor 220 and the negative input of second comparator 208. The other side of second resistor 216 and the other side of fourth resistor 220 are electrically coupled at 204 to receive negative back bias voltage VBB at 204.

First comparator 206 receives negative word line low voltage VNWLL at 202 and the output of first comparator 206 is electrically coupled to the gate of first transistor 210 via comparator output path 228. Second comparator 208 receives negative voltage VN at 236 and the output of second comparator 208 is electrically coupled to the gate of second transistor 212 via comparator output path 232. One side of the drain-source path of first transistor 210 is electrically coupled to receive negative word line low voltage VNWLL at 202. The other side of the drain-source path of first transistor 210 is electrically coupled at 204 to one side of the drain-source path of second transistor 212 to provide negative back bias voltage VBB at 204. The other side of the drain-source path of second transistor 212 is electrically coupled to a reference, such as ground, at 230. The reference at 230 provides a more positive voltage level than negative back bias voltage VBB at 204.

The negative input of first comparator 206 receives reference voltage VREF at 234 and the positive input of first comparator 206 receives input voltage VIN1 at 224 that is based on feedback from negative back bias voltage VBB at 204. First comparator 206 uses negative word line low voltage VNWLL at 202 as a circuit reference voltage to provide output voltages that turn on and off first transistor 210. Reference voltage VREF at 234 is a constant reference voltage and the voltage level of negative back bias voltage VBB at 204 is based on the voltage level of reference voltage VREF at 234.

Input voltage VIN1 at 224 is provided via the resistor divide network of first resistor 214 and second resistor 216. Power supply voltage VDD at 222 is a constant voltage and input voltage VIN1 at 224 varies based on negative back bias voltage VBB at 204. As negative back bias voltage VBB at 204 decreases, input voltage VIN1 at 224 decreases and as negative back bias voltage VBB at 204 increases, input voltage VIN1 at 224 increases. If input voltage VIN1 at 224 is greater than reference voltage VREF at 234, first comparator 206 provides an output voltage level at 228 to turn on first transistor 210 and pull negative back bias voltage VBB at 204 to a lower voltage level, which decreases input voltage VIN1 at 224. If input voltage VIN1 at 224 is less than reference voltage VREF at 234, first comparator 206 provides an output voltage level at 228 to turn off first transistor 210.

The positive input of second comparator 208 receives reference voltage VREF at 234 and the negative input of second comparator 208 receives an input voltage VIN2 at 226 that is based on feedback from negative back bias voltage VBB at 204. Second comparator 208 uses negative voltage VN at 236 as a circuit reference voltage to provide output voltages that turn on and off second transistor 212. Input voltage VIN2 at 226 is provided via the resistor divide network of third resistor 218 and fourth resistor 220. Power supply voltage VDD at 222 is a constant voltage and input voltage VIN2 at 226 varies based on negative back bias voltage VBB at 204. As negative back bias voltage VBB at 204 decreases, input voltage VIN2 at 226 decreases and as negative back bias voltage VBB at 204 increases, input voltage VIN2 at 226 increases. If input voltage VIN2 at 226 is less than reference voltage VREF at 234, second comparator 208 provides an output voltage level at 232 that turns on second transistor 212 and pulls negative back bias voltage VBB at 204 to a higher voltage level, which increases input voltage VIN2 at 226. If input voltage VIN2 at 226 is greater than reference voltage VREF at 234, second comparator 208 provides an output voltage level at 232 that turns off second transistor 212. In one embodiment, the negative input of first comparator 206 and the positive input of second comparator 208 receive different reference voltages.

Resistor values of resistors 214, 216, 218 and 220 and voltage levels of power supply voltage VDD at 222 and reference voltage VREF at 234 are configured to provide a maximum voltage level in negative back bias voltage VBB at 204. If the voltage level of negative back bias voltage VBB at 204 increases above the maximum voltage level, second comparator 208 turns off second transistor 212 and first comparator 206 turns on first transistor 210 to pull negative back bias voltage VBB at 204 to a lower voltage level. Also, resistor values of resistors 214, 216, 218 and 220 and voltage levels of power supply voltage VDD at 222 and reference voltage VREF at 234 are configured to provide a minimum voltage level in negative back bias voltage VBB at 204. If the voltage level of negative back bias voltage VBB at 204 decreases below the minimum voltage level, first comparator 206 turns off first transistor 210 and second comparator 208 turns on second transistor 212 to pull negative back bias voltage VBB at 204 to a higher voltage level.

By regulating negative back bias voltage VBB at 204 out of negative word line low voltage VNWLL at 202, the layout of voltage source 200 can be substantially smaller than the layout of a boost circuit for independently generating the negative back bias voltage VBB. The smaller layout of voltage source 200 saves valuable layout space that can be used for memory cells and/or to lower the cost of the RAM chip.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A random access memory, comprising:
an array of single transistor memory cells; and
a voltage source configured to receive a negative word line voltage and a reference voltage and to provide an output voltage out of the negative word line voltage and based on the reference voltage, wherein the voltage source comprises:
   a first transistor configured to receive the negative word line voltage and to pull the output voltage toward the negative word line voltage based on a comparison of the output voltage and the reference voltage.

2. The random access memory of claim 1, wherein the voltage source comprises:
   a comparator configured to receive the reference voltage and an input voltage based on feedback from the output voltage and to compare the reference voltage and the input voltage and provide a comparator output voltage that is based on the comparison of the reference voltage and the input voltage, wherein the first transistor is configured to receive the comparator output voltage and to regulate the output voltage based on the comparator output voltage.

3. The random access memory of claim 1, wherein the voltage source comprises:
   a second transistor configured to provide a current source to regulate the output voltage.

4. A random access memory, comprising:
an array of single transistor memory cells;
a voltage source configured to receive a boosted supply voltage and a reference voltage and to provide an output voltage out of the boosted supply voltage and based on the reference voltage, wherein the voltage source comprises:
   a first comparator configured to receive the reference voltage and a first input voltage based on feedback from the output voltage and to compare the reference voltage and the first input voltage and provide a first comparator output voltage that is based on the comparison of the reference voltage and the first input voltage;
   a first transistor configured to receive the boosted supply voltage and the first comparator output voltage and to regulate the output voltage based on the first comparator output voltage; and
   a second transistor configured to provide a current source to regulate the output voltage.

5. A random access memory, comprising:
an array of single transistor memory cells;
a voltage source configured to receive a boosted supply voltage and a reference voltage and to provide an output voltage out of the boosted supply voltage and based on the reference voltage, wherein the voltage source comprises:
   a first comparator configured to receive the reference voltage and a first input voltage based on feedback from the output voltage and to compare the reference voltage and the first input voltage and provide a first comparator output voltage that is based on the comparison of the reference voltage and the first input voltage;
   a first transistor configured to receive the boosted supply voltage and the first comparator output voltage and to regulate the output voltage based on the first comparator output voltage;
   a second comparator configured to receive the reference voltage and a second input voltage based on feedback from the output voltage and to compare the reference voltage and the second input voltage and provide a second comparator output voltage that is based on the comparison of the reference voltage and the second input voltage; and
   a second transistor configured to receive the second comparator output voltage and to regulate the output voltage based on the second comparator output voltage.

6. A random access memory, comprising:
an array of random access memory cells;
a voltage source configured to receive a negative word line voltage and to provide an output voltage out of the negative word line voltage, wherein the voltage source comprises:
   a first comparator configured to receive a first reference voltage and a first input voltage that is based on feedback from the output voltage and to compare the first reference voltage and the first input voltage and provide a first comparator output voltage;
   a second comparator configured to receive a second reference voltage and a second input voltage that is based on feedback from the output voltage and to compare the second reference voltage and the second input voltage and provide a second comparator output voltage; and
   a first transistor configured to receive the negative word line voltage and the first comparator output voltage and to pull the cutout voltage toward the negative word line voltage based on the first comparator output voltage, wherein the voltage source regulates the output voltage out of the negative word line voltage via the first comparator output voltage and the second comparator output voltage.

7. The random access memory of claim 6, wherein the voltage source comprises:
   a second transistor configured to receive a pull up voltage and the second comparator output voltage and to pull the output voltage toward the pull-up voltage based on the second comparator output voltage.

8. A random access memory, comprising:
an array of random access memory cells;
a voltage source configured to receive a boosted supply voltage and to provide an output voltage out of the boosted supply voltage, wherein the voltage source comprises:
   a first comparator configured to receive a first reference voltage and a first input voltage that is based on feedback from the output voltage and to compare the first reference voltage and the first input voltage and provide a first comparator output voltage;

a second comparator configured to receive a second reference voltage and a second input voltage that is based on feedback from the output voltage and to compare the second reference voltage and the second input voltage and provide a second comparator output voltage, wherein the voltage source regulates the output voltage out of the boosted supply voltage via the first comparator output voltage and the second comparator output voltage;

a first transistor configured to receive the boosted supply voltage and the first comparator output voltage and to pull the output voltage toward the boosted supply voltage based on the first comparator output voltage; and a second transistor configured to receive the second comparator output voltage and to pull the output voltage away from the boosted supply voltage based on the second comparator output voltage.

9. The random access memory of claim 6, wherein the first reference voltage received at the first comparator and the second reference voltage received at the second comparator are substantially equal.

10. The random access memory of claim 6, wherein the negative word line voltage received at the voltage source provides word line bias and the output voltage provides transistor well back bias.

11. A random access memory, comprising:

an array of random access memory cells, wherein each of the random access memory cells includes a transistor well configured to receive a back bias voltage;

word lines crossing random access memory cells in the array of random access memory cells, wherein each of the word lines is configured to receive a word line voltage; and a voltage source configured to receive the word line voltage and regulate the back bias voltage out of the word line voltage, wherein the voltage source comprises:

a first comparator configured to receive a first reference voltage and a first input voltage that is based on the back bias voltage and to compare the first reference voltage and the first input voltage and provide a first comparator output voltage;

a first transistor configured to receive the word line voltage and the first comparator output voltage and to pull the back bias voltage toward the word line voltage based on the first comparator output voltage;

a second comparator configured to receive a second reference voltage and a second input voltage that is based on the back bias voltage and to compare the second reference voltage and the second input voltage and provide a second comparator output voltage; and a second transistor configured to receive the second comparator output voltage and to pull the back bias voltage away from the word line voltage based on the second comparator output voltage.

12. The random access memory of claim 11, wherein the first reference voltage received at the first comparator and the second reference voltage received at the second comparator are substantially equal.

13. The random access memory of claim 11, wherein the back bias voltage regulated out of the word line voltage via the voltage source is a negative back bias voltage value and the word line voltage is a negative word line voltage value.

14. A random access memory, comprising:
means for storing data in an array of memory cells;
means for receiving a negative word line voltage and a reference voltage; and
means for regulating an output voltage out of the negative word line voltage and based on the reference voltage, comprising:
means for pulling the output voltage toward the negative word line voltage based on a comparison of the output voltage and the reference voltage.

15. The random access memory of claim 14, wherein the means for regulating comprises:
means for providing a first input voltage based on the output voltage;
means for comparing the reference voltage and the first input voltage; and
means for providing a first comparison output voltage that is based on the comparison of the reference voltage and the first input voltage.

16. The random access memory of claim 15, wherein the means for pulling the output voltage comprises:
means for pulling the output voltage toward the negative word line voltage based on the first comparison output voltage.

17. The random access memory of claim 16, wherein the means for regulating comprises:
means for providing a current source to regulate the output voltage.

18. The random access memory of claim 16, wherein the means for regulating comprises:
means for providing a second input voltage based on the output voltage;
means for comparing the reference voltage and the second input voltage;
means for providing a second comparison output voltage that is based on the comparison of the reference voltage and the second input voltage; and
means for pulling the output voltage toward a pull-up voltage based on the second comparison output voltage.

19. A random access memory, comprising:
means for storing data in an array of random access memory cells;
means for receiving a first reference voltage and a first input voltage that is based on feedback from an output voltage;
means for comparing the first reference voltage and the first input voltage to provide a first comparison output voltage;
means for receiving a second reference voltage and a second input voltage that is based on feedback from the output voltage;
means for comparing the second reference voltage and the second input voltage to provide a second comparison output voltage; and
means for regulating the output voltage out of a negative word line voltage via the first comparison output voltage and the second comparison output voltage, wherein the means for regulating comprises:
means for receiving the negative word line voltage and the first comparison output voltage and pulling the output voltage toward the negative word line voltage based on the first comparison output voltage.

20. The random access memory of claim 19, wherein the means for regulating comprises:
means for pulling the output voltage away from the negative word line voltage based on the second comparison output voltage.

21. The random access memory of claim 19, wherein the negative word line voltage provides word line bias and the output voltage provides transistor well back bias.

22. A method for providing a voltage in a random access memory, comprising:
receiving a negative word line voltage that provides word line bias in an array of random access memory cells;
receiving a reference voltage; and
regulating an output voltage that provides transistor well back bias in the array of random access memory cells out of the negative word line voltage and based on the reference voltage, comprising:
pulling the output voltage toward the negative word line voltage based on a comparison of the output voltage and the reference voltage.

23. The method of claim 22, wherein regulating an output voltage comprises:
feeding back the output voltage to provide a first input voltage to a comparator;
comparing the reference voltage and the first input voltage; and
outputting a first comparator output voltage that is based on the comparison of the reference voltage and the first input voltage.

24. The method of claim 23, wherein pulling the output voltage comprises:
pulling the output voltage toward the negative word line voltage based on the first comparator output voltage.

25. The method of claim 24, wherein regulating an output voltage comprises:
sourcing a current to regulate the output voltage.

26. The method of claim 24, wherein regulating an output voltage comprises:
feeding back the output voltage to provide a second input voltage;
comparing the reference voltage and the second input voltage;
providing a second comparator output voltage that is based on the comparison of the reference voltage and the second input voltage; and
pulling the output voltage toward a pull-up voltage based on the second comparator output voltage.

27. A method for providing a voltage in a random access memory, comprising:
receiving a negative word line voltage that provides word line bias in an array of random access memory cells;
receiving a first input voltage that is based on feedback from an output voltage;
comparing a first reference voltage and the first input voltage to provide a first comparison output voltage;
receiving a second input voltage that is based on feedback from the output voltage;
comparing a second reference voltage and the second input voltage to provide a second comparison output voltage;
regulating the output voltage that provides transistor well back bias in the array of random access memory cells out of the negative word line voltage via the first comparison output voltage and the second comparison output voltage, wherein regulating the output voltage comprises:
receiving the negative word line voltage and the first comparison output voltage; and,
pulling the output voltage toward the negative word line voltage based on the first comparison output voltage.

28. The method of claim 27, wherein regulating the output voltage comprises:
pulling the output voltage away from the negative word line voltage based on the second comparison output voltage.

29. A method for providing a back bias voltage in a random access memory, comprising:
receiving a word line voltage in an array of random access memory cells;
receiving a first reference voltage and a first input voltage that is based on the back bias voltage at a first comparator;
comparing the first reference voltage and the first input voltage via the first comparator to provide a first comparator output voltage;
receiving the word line voltage and the first comparator output voltage at a first transistor;
pulling the back bias voltage toward the word line voltage based on the first comparator output voltage;
receiving a second reference voltage and a second input voltage that is based on the back bias voltage at a second comparator;
comparing the second reference voltage and the second input voltage via the second comparator to provide a second comparator output voltage;
receiving the second comparator output voltage at a second transistor; and
pulling the back bias voltage away from the word line voltage based on the second comparator output voltage.

30. The method of claim 29, wherein the first reference voltage received at the first comparator and the second reference voltage received at the second comparator are substantially equal.

31. The method of claim 29, wherein the back bias voltage regulated out of the word line voltage is a negative back bias voltage value and the word line voltage is a negative word line voltage value.

* * * * *